US008541869B2

(12) United States Patent
Nakamura et al.

(10) Patent No.: US 8,541,869 B2
(45) Date of Patent: Sep. 24, 2013

(54) CLEAVED FACET (GA,AL,IN)N EDGE-EMITTING LASER DIODES GROWN ON SEMIPOLAR BULK GALLIUM NITRIDE SUBSTRATES

(75) Inventors: Shuji Nakamura, Santa Barbara, CA (US); James S. Speck, Goleta, CA (US); Steven P. DenBaars, Goleta, CA (US); Anurag Tyagi, Goleta, CA (US)

(73) Assignee: The Regents of the University of California, Oakland, CA (US)

( * ) Notice: Subject to any disclaimer, the term of this patent is extended or adjusted under 35 U.S.C. 154(b) by 817 days.

(21) Appl. No.: 12/030,099

(22) Filed: Feb. 12, 2008

(65) Prior Publication Data

US 2008/0191223 A1 Aug. 14, 2008

Related U.S. Application Data

(60) Provisional application No. 60/889,518, filed on Feb. 12, 2007.

(51) Int. Cl.
*H01L 33/16* (2010.01)

(52) U.S. Cl.
USPC .......... 257/627; 257/14; 257/103; 257/613; 257/E33.003; 438/33; 438/46; 438/973; 372/44.011

(58) Field of Classification Search
USPC ......... 257/79–103, 9–39, 428–466, 613–616, 257/618–628, E33.003, E33.025, E33.028, 257/E33.03, E33.033; 438/22–47, 106–127, 438/460–465, 478–509, 973; 117/11–83; 372/43.01–50.23
See application file for complete search history.

(56) References Cited

U.S. PATENT DOCUMENTS

| 5,821,568 | A * | 10/1998 | Morita et al. ................ 257/94 |
| 6,072,197 | A * | 6/2000 | Horino et al. ............... 257/103 |
| 6,316,785 | B1 | 11/2001 | Nunoue et al. |
| 7,508,003 | B2 * | 3/2009 | Sarayama et al. ........... 257/86 |
| 7,727,874 | B2 * | 6/2010 | Hanser et al. ................ 438/604 |
| 7,843,980 | B2 * | 11/2010 | Ohta et al. ................ 372/44.011 |
| 7,858,995 | B2 * | 12/2010 | Nakagawa et al. ........... 257/89 |
| 2002/0144645 | A1 | 10/2002 | Kim et al. |
| 2003/0024475 | A1 | 2/2003 | Anderson |

(Continued)

FOREIGN PATENT DOCUMENTS

| JP | 2001176823 A | 6/2001 |
| JP | 2006128661 A | 5/2006 |

OTHER PUBLICATIONS

"Blue, Green, and Amber InGaN/GaN Light-Emitting Diodes on Semipolar {11-22} GaN Bulk Substrates", Funato et al. (Jpn. J. Appl. Phys. 45 (2006) L659-L662).*

(Continued)

Primary Examiner — Asok K Sarkar
Assistant Examiner — Eric Ward
(74) Attorney, Agent, or Firm — Gates & Cooper LLP

(57) ABSTRACT

A III-nitride edge-emitting laser diode is formed on a surface of a III-nitride substrate having a semipolar orientation, wherein the III-nitride substrate is cleaved by creating a cleavage line along a direction substantially perpendicular to a nonpolar orientation of the III-nitride substrate, and then applying force along the cleavage line to create one or more cleaved facets of the III-nitride substrate, wherein the cleaved facets have an m-plane or a-plane orientation.

10 Claims, 2 Drawing Sheets

(56) References Cited

U.S. PATENT DOCUMENTS

| | | | |
|---|---|---|---|
| 2005/0142391 | A1 | 6/2005 | Dmitriev et al. |
| 2005/0161697 | A1 | 7/2005 | Nakahata et al. |
| 2005/0205884 | A1 | 9/2005 | Kim et al. |
| 2005/0258451 | A1 | 11/2005 | Saxler et al. |
| 2006/0205199 | A1* | 9/2006 | Baker et al. ............... 438/604 |
| 2007/0015345 | A1 | 1/2007 | Baker et al. |
| 2008/0173882 | A1* | 7/2008 | Parikh et al. ............... 257/94 |
| 2008/0308815 | A1* | 12/2008 | Kasai et al. ............... 257/76 |
| 2009/0238227 | A1* | 9/2009 | Kubota et al. ............ 372/45.011 |

OTHER PUBLICATIONS

"Milliwatt Power Blue InGaN/GaN Light-Emitting Diodes on Semipolar GaN Templates", Chakraborty et al. (Jpn. J. Appl. Phys. vol. 44 No. 30 2005 L945-L947).*

"Epitaxial growth and optical properties of semipolar (11-22) GaN and InGaN/GaN quantum wells on GaN bulk substrates" Ueda et al. (Appl. Phys. Let. 80, 211907 2006).*

"Demonstration of semipolar (10-1-3) InGaN/GaN green light emitting diode" Sharma et al. (Appl. Phys. Let. 87, 231110 2005).*

Abare, A.C. et al., "Cleaved and Etched Facet Nitride Laser Diodes," IEEE Journal of Selected Topic in Quantum Electronics, May/Jun. 1998, pp. 505-509, vol. 4, No. 3.

Khan, M.A. et al., "Cleaved cavity optically pumped InGaN-GaN laser grown on spinel substrates," Appl. Phys. Lett., Oct. 14, 1996, pp. 2418-2420, vol. 69, No. 16.

Park, S.H. et al., "Crystal orientation effects on electronic properties of wurtzite InGaN/GaN quantum wells," J. Appl. Physics, Jun. 15, 2002, pp. 9904-9908, vol. 91, No. 12.

Romanov, A.E. et al., "Strain-induced polarization in wurtzite III-nitride semipolar layers," J. Appl. Phys., 2006, pp. 023522-1-023533-10, vol. 100.

Schoedl, U.T. et al., "Facet degradation of GaN heterostructure laser diodes," J. Appl. Phys., 2005, pp. 123102-1-123102-8, vol. 97.

Smeeton, T.M. et al., "Atomic force microscopy analysis of cleaved facets in III-nitride laser diodes grown on free-standing GaN substrates," Appl. Phys. Lett., 2006, pp. 041910-1-041910-3, vol. 88.

Shao, Y-P. et al., "Electrical Characterization of Semipolar Gallium Nitride Thin Films," NNIN REU Research Accomplishments, Aug. 2005, pp. 132-133.

PCT/US2008/01843 International Search Report.

Funato et al., "Blue, Green and Amber InGaN/GaN Light-Emitting Diodes on Semipolar {1122} GaN Bulk Substrates". Japanese Journal of Applied Physics, vol. 45, No. 26, 2006, pp. L659-L662.

Japanese Office Action mailed on Jul. 26, 2012 for Japanese application No. 2009-549142.

Japanese Office Action dated Jul. 26, 2012 for JP application No. 2009-549142.

Funato et al., "Blue, Green, and Amber InGaN/GaN Light-Emitting Diodes on Semipolar {1122} GaN Bulk Substrates". Japanese Journal of Applied Physics, vol. 45, No. 26, 2006, pp. L659-L662.

Japanese Office Action (with English translation) dated Feb. 18, 2013 for Japanese Patent Application No. 2009-549142.

* cited by examiner

US 8,541,869 B2

CLEAVED FACET (GA,AL,IN)N EDGE-EMITTING LASER DIODES GROWN ON SEMIPOLAR BULK GALLIUM NITRIDE SUBSTRATES

CROSS-REFERENCE TO RELATED APPLICATION

This application claims the benefit under 35 U.S.C. Section 119(e) of the following and commonly-assigned U.S. patent application:

U.S. Provisional Application Ser. No. 60/889,518, filed on Feb. 12, 2007, by Shuji Nakamura, James S. Speck, Steven P. DenBaars, and Anurag Tyagi, entitled "CLEAVED FACET (Ga,Al,In)N EDGE-EMITTING LASER DIODES GROWN ON SEMIPOLAR {11-2n} BULK GaN SUBSTRATES,"
which application is incorporated by reference herein.

BACKGROUND OF THE INVENTION

1. Field of the Invention

The present invention is related to a semiconductor optical device based on a semipolar substrate.

2. Description of the Related Art (Note: This application references a number of different publications as indicated throughout the specification by one or more reference numbers within parentheses, e.g., (Ref. X). A list of these different publications ordered according to these reference numbers can be found below in the section entitled "References." Each of these publications is incorporated by reference herein.)

State of the art Group-III nitride lasers are either grown on readily available c-plane sapphire substrates or on expensive SiC or bulk GaN substrates. All of them are grown along the polar [0001] c-orientation of (Ga,In,Al)N (also referred to as "Group-III nitride", "III-nitride", or just "nitride"). The laser diodes grown on sapphire usually employ dry-etched facets which lead to higher losses and consequently to reduced efficiency. The devices grown on SiC or bulk GaN substrates can have cleaved mirror facets.

However, laser diodes grown on various semipolar orientations have much lower polarization-induced electric fields as compared to those grown on the polar [0001] c-orientation (Ref. 1). Theoretical studies (Ref 2) indicate that strained InGaN/GaN MQWs grown on semipolar orientations are expected have significantly lower effective hole masses than strained c-plane InGaN quantum wells. This should lead to a reduction in the threshold of semipolar (Ga,In,Al)N laser diodes as compared to those fabricated on c-plane GaN. Thus, the cleaved facet, (Ga,Al,In)N edge-emitting laser diodes grown on semipolar {11-2n} III-nitride substrates of the present invention offer the promise of improved efficiency.

Recently, (Ga,In,Al)N edge-emitting laser diodes with {10-10} m-plane cleaved facets, fabricated on [0001] c-oriented bulk GaN substrates, have been reported (Ref. 3). However, no (Ga,In,Al)N laser diodes grown on semipolar {11-2n} (where n can assume any value, e.g., 2, −2) or semipolar {10-11} (where l can assume values such as 1, −1, 3, −3, etc.) bulk GaN substrates have been demonstrated.

Cleaved facet (Ga,In,Al)N edge-emitting laser diodes grown hetero-epitaxially on substrates, for example, a-plane sapphire, 6H—SiC, (111) spinel, etc. (Ref. 4-6), have also been previously reported. However, such laser diodes grown hetero-epitaxially on foreign substrates (e.g., a-plane sapphire, 6H—SiC, (111) spinel, etc.) exhibit inferior performance compared to those which are grown homo-epitaxially on bulk GaN substrates, due to the high defect densities arising from the large lattice mismatch between the epitaxial layers and the foreign substrate.

(Ga,Al,In)N based electronic and optoelectronic devices are mostly grown on GaN, which has a wurtzite crystal structure. For the wurtzite crystal structure, the (1-100) m-plane is perpendicular to the {11-2n} family of crystal planes, and is a naturally cleaving plane. This enables the present invention to grow edge-emitting laser diodes on semipolar {11-2n} III-nitride substrates, such as bulk GaN substrates, which employ atomically-smooth cleaved (1-100) m-plane mirror facets with high reflectivity.

In the prior art, (Ga,Al,In)N based edge-emitting laser diodes usually employ dry-etched facets, which are inherently rough. Moreover, it is difficult to achieve perfectly vertical facets using dry-etching techniques. This leads to scattering loss, and consequently, reduced reflectivity at the facets, resulting in inferior device performance.

The present invention combines the advantages of growing (In,Ga,Al)N devices on semipolar orientations (low polarization-induced electric fields in InGaN/GaN quantum wells (QWs), theoretically predicted lower effective hole masses compressively strained $In_xGa_{1-x}N$ QWs, etc.), with the low loss cavity achieved by cleaved mirror facets, to enable the fabrication of superior performance devices.

SUMMARY OF THE INVENTION

To overcome the limitations in the prior art described above, and to overcome other limitations that will become apparent upon reading and understanding the present specification, the present invention discloses an optoelectronic device, comprising a III-nitride edge-emitting laser diode is formed on a surface of a III-nitride substrate having a semipolar orientation, wherein the III-nitride substrate is cleaved by creating a cleavage line along a direction substantially perpendicular to a nonpolar orientation of the III-nitride substrate, and then applying force along the cleavage line, to create one or more cleaved facets of the III-nitride substrate, wherein the cleaved facets have an m-plane or a-plane orientation.

BRIEF DESCRIPTION OF THE DRAWINGS

Referring now to the drawings in which like reference numbers represent corresponding parts throughout.

DETAILED DESCRIPTION OF THE INVENTION

In the following description of the preferred embodiment, reference is made to the accompanying drawings that form a part hereof, and in which is shown by way of illustration a specific embodiment in which the invention may be practiced. It is to be understood that other embodiments may be utilized and structural changes may be made without departing from the scope of the present invention.

The present invention discloses a III-nitride semiconductor light emitting device formed on a surface of a III-nitride substrate having a semipolar orientation, for example, an edge-emitting laser diode, comprised of semiconductor material alloys (Ga,In,Al)N, namely Group-III nitride layers (also known as III-nitride layers), such as gallium-containing, indium-containing, and/or aluminum-containing nitride layers. The device is fabricated using well-established semiconductor device processing techniques.

Figure 1:
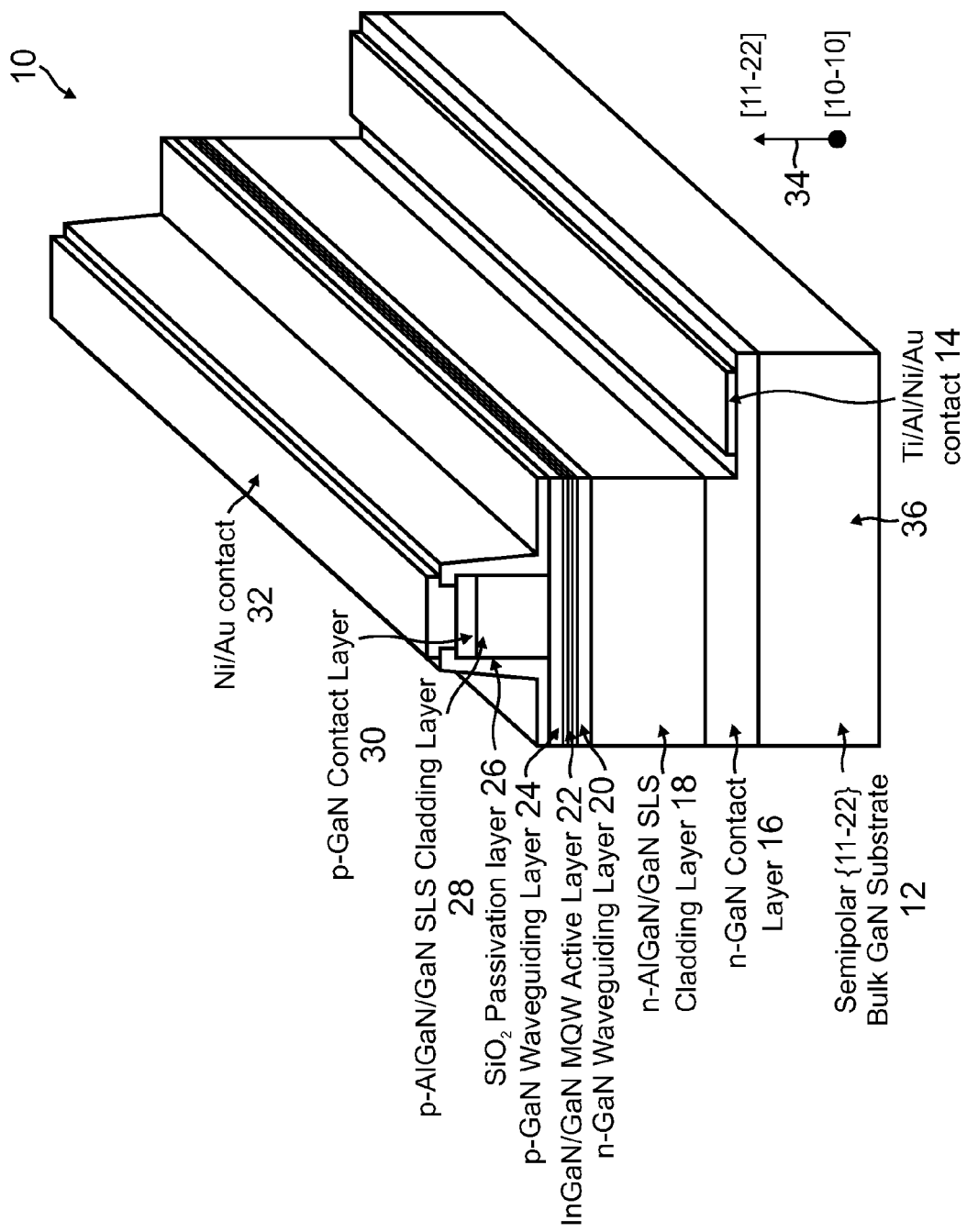
FIG. 1 is a schematic of the present invention wherein the cross-section is along the mirror facet parallel to the (10-10) m-plane.

FIG. 1 is a detailed schematic of one embodiment of the device of the present invention, although alternative embodiments are suggested in a subsequent section. The device structure 10 comprises a Group-III nitride, edge-emitting, ridge (index-guided) laser structure grown homo-epitaxially on a semipolar III-nitride substrate 12, such as a semipolar {11-22} or {11-2-2} bulk GaN substrate, using standard semiconductor lithography, etching and deposition processes. The device structure 10 includes a Ti/Al/Ni/Au contact 14, n-type GaN (n-GaN) contact layer 16, n-type AlGaN/GaN (n-AlGaN/GaN) strained layer superlattice (SLS) cladding layer 18, n-GaN waveguiding layer 20, InGaN/GaN multiple quantum well (MQW) active layer 22, p-type GaN (p-GaN) waveguiding layer 24, $SiO_2$ passivation layer 26, p-type AlGaN/GaN (p-AlGaN/GaN) SLS cladding layer 28, p-GaN contact layer 30, and Ni/Au contact 32. The detailed epitaxial structure 10 illustrated in FIG. 1 is created using a conventional metal organic chemical vapor deposition (MOCVD) process, although other processes may be used as well. Moreover, the laser stripes represented by layers 12-32 are oriented in a nonpolar direction, such as an [10-10] m-direction, as shown by arrow 34.

After fabrication of the device 10, the substrate 12 may be thinned down to facilitate cleaving. Cleaving is performed by scribing the substrate 12 to create a cleavage line (not shown) along a direction substantially perpendicular to a nonpolar orientation of the substrate 12, for example, the [10-10] m-direction. Rather than scribing the substrate 12, focused ion beam (FIB) etching may be used to create the cleavage line (Ref. 5). Subsequently, force is evenly applied along the cleavage line to create one or more cleaved facets 36 on the substrate 12, wherein the cleaved facets 36 have a nonpolar orientation, which may be either an m-plane or a-plane orientation. The cleaved facets 36 are smoother than facets created using other techniques, and thus may serve as mirrors to form a Fabry-Perot cavity for the laser device structure 10.

Figure 2:
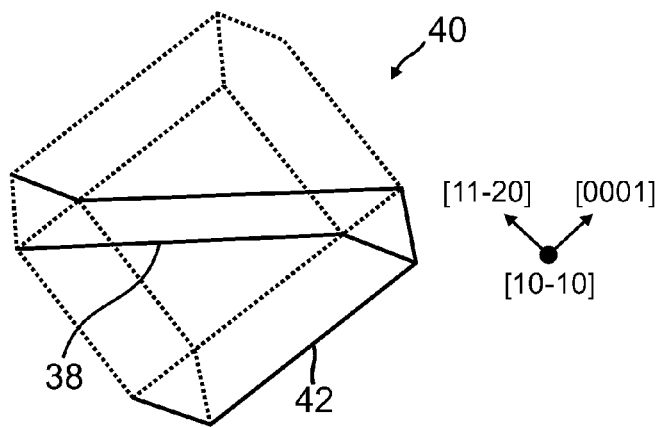
FIG. 2 is a schematic of the {11-22} or {11-2-2} plane with respect to the GaN wurtzite cell.

FIG. 2 shows a schematic of the semipolar growth plane (11-22) or {11-2-2} 38 with respect to the GaN wurtzite cell 40. It can be seen that the (10-10) m-plane 42 is perpendicular to the semipolar growth plane (11-22) or {11-2-2} 38. As discussed above, facets formed by dry-etching techniques are inherently rough and are not perfectly vertical (with respect to the epi-surface). This leads to higher scattering losses from the mirror facets and consequently increases the threshold current density of the laser. By incorporating (10-10) m-plane cleaved mirror facets 38 in an edge-emitting laser diode 10, mirror loss can be significantly reduced, and device efficiency can be enhanced.

Figure 3:
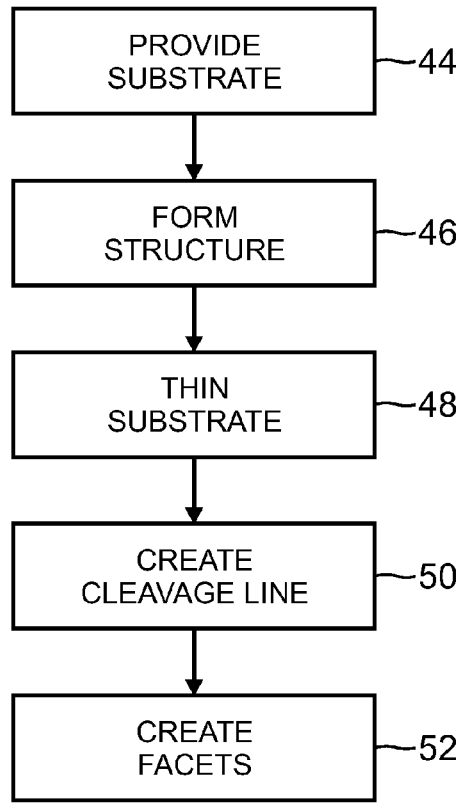
FIG. 3 is a flowchart that illustrates one embodiment of the fabrication process for a device of the present invention.

FIG. 3 is a flowchart that illustrates one embodiment of a process for fabricating a Group-III nitride semiconductor light emitting device 10, which is comprised of Group-III nitride layers formed on a surface of a group-III nitride substrate 12 having a semipolar orientation. The fabrication of the device 10 may use well-established semiconductor device processing techniques, including lithography, etching and deposition processes.

Block 44 represents the step of providing a semipolar Group-III nitride substrate 12, such as a semipolar {11-22} or {11-2-2} bulk GaN substrate 12.

Block 46 represents the step of homo-epitaxially forming the device structure 10 on the substrate 12, which includes fabricating the Ti/Al/Ni/Au contact 14, n-GaN contact layer 16, n-AlGaN/GaN SLS cladding layer 18, n-GaN waveguiding layer 20, InGaN/GaN MQW active layer 22, p-GaN waveguiding layer 24, $SiO_2$ passivation layer 26, p-AlGaN/GaN SLS cladding layer 28, p-GaN contact layer 30, and Ni/Au contact 32.

Block 48 represents the optional step of thinning down the substrate 12, after fabrication of the device 10, to facilitate cleaving.

Blocks 50-52 represent the cleaving being performed, wherein Block 50 represents the step of scribing the substrate 12 to create a cleavage line along a direction substantially perpendicular to a nonpolar orientation of the substrate 12, for example, the [10-10] m-direction, and Block 52 represents the step of force being evenly applied along the cleavage line to create one or more cleaved facets 36 on the substrate 12, wherein the cleaved facets 36 have a nonpolar orientation, which may be either an m-plane or a-plane orientation.

The end result of these steps is the device structure 10, such as the structure shown in FIG. 1.

Possible Modifications and Variations

There are a number of possible modifications and variations of the invention.

Substrate materials other than GaN (e.g., AlN, InN) can be used in practicing this invention. Substrates with other semipolar orientations, including, but not limited to {10-11} (where l can be −3, −1, 1, 3, etc.) can be used. The cleaved facets for (Ga,In,Al)N edge-emitting laser diodes grown on these substrates will be along the (11-20) a-plane. The substrate may also be thinned and/or polished in some instances.

Variations in (Ga,In,Al)N quantum well and heterostructure design are possible without departing from the scope of the present invention. Various types of gain-guided and index guided laser diode structures can be fabricated. Moreover, the specific thickness and composition of the layers, the number of quantum wells grown, and the inclusion or omission of electron blocking layers are variables inherent to particular device designs and may be used in alternative embodiments of the present invention.

The cladding layers, as depicted in FIG. 1, may be n-type, p-type, unintentionally doped (UID), co-doped, or semi-insulating, and may be composed of any (Ga,In,Al)N alloy, as well as other materials with desirable properties.

The contacts (both p-type and n-type contacts) may use other materials, e.g., Pd, Ag, Cu, ZnO, etc.

The cleaved facets described above maybe used for other semiconductor devices besides laser diodes (e.g., edge-emitting light emitting diodes (LEDs)).

The facets may also be applied with different coatings to alter the reflectivity (e.g., high reflectivity (HR) or anti-reflective (AR) coatings, distributed Bragg reflector (DBR) mirrors, etc.)

In the preferred embodiment of the device, a single lateral n-type contact (n-contact) is made. Different contact schemes, including, but not limited to, double lateral contacts, flip-chip and back-side contacts (n-contact to substrate, thus forming a vertical device structure) can be employed in alternative embodiments of the invention.

The described structure is an electrically-pumped device. An optically-pumped device can also be envisioned.

Advantages and Improvements Over Existing Practice

The purpose of the invention is for use as an optical source for various commercial, industrial, or scientific applications. For example, semipolar (Ga,In,Al)N edge-emitting laser diodes could provide an efficient, simple optical head for DVD players. Another application, which results from the shorter wavelength (for violet lasers) and smaller spot size provided by (Ga,In,Al)N semipolar lasers, is high resolution printing. Semipolar laser diodes offer the possibility of lower thresholds and it may even be possible to create laser diodes that emit in the longer wavelength regions of the visible spectrum (e.g., green (Ga,In,Al)N lasers). These devices would find applications in projection displays and medical imaging and are also strong candidates for efficient solid-state lighting, high brightness lighting displays, and may offer higher wall-plug efficiencies than can be achieved with LEDs.

REFERENCES

The following references are incorporated by reference herein:

1. A. E. Romanov, T J. Baker, S. Nakamura, and J. S. Speck: J. Appl. Phys. 100 (2006) 0253522.
2. S. H. Park: J. Appl. Phys., 91, (2002) 9904.
3. T. M. Smeeton, V. Bousquet, S. E. Hooper, M. Kauer, and J. Heffeman: Appl. Phys. Lett., 88 (2006) 041910.
4. A. C. Abare, M. P. Mack, M. Hansen, R. K. Sink, P. Kozodoy, S. Keller, J. S. Speck, J. E. Bowers, U. K. Mishra, L. A. Coldren and S. P. Denbaars: IEEE J. Sel. Top. Quantum Electron., 4 (1998) 505.
5. T. Schoedl, U. T. Scwarz, V. Kummler, M. Furisch, A. Leber, A. Miler, A. Lell, and V. Harle: J. Appl. Phys., 97, (2005) 123102.
6. M. A. Khan, C. J. Sun, J. W. Yang, Q. Chen, B. W. Lim, M. Z. Anwar, A. Osinsky and H. Temkin: Appl. Phys. Lett., 69 (1996) 2420.

Conclusion

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching, without fundamentally deviating from the essence of the present invention. It is intended that the scope of the invention be limited not by this detailed description, but rather by the claims appended hereto.

What is claimed is:

1. An optoelectronic device, comprising:
   a III-nitride semiconductor light emitting device formed on a surface of a III-nitride substrate having a semipolar orientation, wherein the III-nitride substrate is a semipolar bulk III-nitride substrate and the III-nitride substrate is cleaved along a direction substantially perpendicular to the surface of the III-nitride substrate having the semipolar orientation, in order to create one or more cleaved facets, wherein the substrate has a cleavage line along a direction substantially perpendicular to a nonpolar orientation of the substrate for the cleaved facets.

2. The method of claim 1, wherein the III-nitride semiconductor light emitting device is an edge-emitting laser diode.

3. The device of claim 1, wherein the semipolar bulk III-nitride substrate is a semipolar bulk gallium nitride substrate.

4. The device of claim 1, wherein the cleaved facets have an m-plane or a-plane orientation.

5. The device of claim 1, wherein the III-nitride substrate is thinned to facilitate cleaving.

6. A process for fabricating an optoelectronic device, comprising:
   forming a III-nitride semiconductor light emitting device on a surface of a III-nitride substrate having a semipolar orientation, wherein the III-nitride substrate is a semipolar bulk III-nitride substrate; and
   cleaving the III-nitride substrate along a direction substantially perpendicular to the surface of the III-nitride substrate having the semipolar orientation, in order to create one or more cleaved facets;
   wherein the cleaving step comprises creating a cleavage line along a direction substantially perpendicular to a nonpolar orientation of the substrate, and then applying force along the cleavage line to create the cleaved facets.

7. The method of claim 6, wherein the III-nitride semiconductor light emitting device is an edge-emitting laser diode.

8. The method of claim 6, wherein the semipolar bulk III-nitride substrate is a semipolar bulk gallium nitride substrate.

9. The method of claim 6, wherein the cleaved facets have an m-plane or a-plane orientation.

10. The method of claim 6, further comprising thinning the III-nitride substrate to facilitate cleaving.

* * * * *